(12) United States Patent
Augendre et al.

(10) Patent No.: US 8,853,785 B2
(45) Date of Patent: Oct. 7, 2014

(54) INTEGRATED CIRCUIT WITH ELECTROSTATICALLY COUPLED MOS TRANSISTORS AND METHOD FOR PRODUCING SUCH AN INTEGRATED CIRCUIT

(75) Inventors: Emmanuel Augendre, Montbonnot (FR); Maud Vinet, Rives (FR); Laurent Clavelier, Grenoble (FR); Perrine Batude, Dijon (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 168 days.

(21) Appl. No.: 12/868,488

(22) Filed: Aug. 25, 2010

(65) Prior Publication Data

US 2011/0147849 A1    Jun. 23, 2011

(30) Foreign Application Priority Data

Sep. 7, 2009  (FR) ..................... 09 56081

(51) Int. Cl.
*H01L 27/088*  (2006.01)

(52) U.S. Cl.
USPC ......................................... 257/368

(58) Field of Classification Search
USPC ......... 257/314, 324, 351, 368, 369, 393, 414, 257/415; 438/109, 197
See application file for complete search history.

(56) References Cited

U.S. PATENT DOCUMENTS

| | | | | |
|---|---|---|---|---|
| 5,306,655 A | * | 4/1994 | Kurimoto | 438/302 |
| 5,612,552 A | * | 3/1997 | Owens | 257/202 |
| 5,770,483 A | * | 6/1998 | Kadosh et al. | 438/152 |
| 5,863,818 A | | 1/1999 | Kadosh et al. | |
| 5,998,273 A | | 12/1999 | Ma et al. | |
| 6,767,835 B1 | | 7/2004 | Nariman et al. | |
| 2003/0094633 A1 | | 5/2003 | Gonzalez et al. | |
| 2005/0275038 A1 | * | 12/2005 | Shih et al. | 257/382 |
| 2008/0128780 A1 | | 6/2008 | Nishihara et al. | |

FOREIGN PATENT DOCUMENTS

| | | |
|---|---|---|
| JP | 61-43463 A | 3/1986 |
| WO | WO 2007/139862 A2 | 12/2007 |

OTHER PUBLICATIONS

French Search Report mailed on Apr. 15, 2010 in corresponding French Application No. 0956081 filed on Sep. 7, 2009 (with Translation of Categories).

(Continued)

*Primary Examiner* — Marcos D. Pizarro
*Assistant Examiner* — Suian Tang
(74) *Attorney, Agent, or Firm* — Oblon, Spivak, McClelland, Maier & Neustadt, L.L.P.

(57) ABSTRACT

An integrated circuit including at least: a first MOS transistor; a second MOS transistor, arranged on the first MOS transistor, the second MOS transistor including a channel region in at least one semiconductor layer including two approximately parallel primary faces; a portion of at least one electrically conductive material electrically connected to a gate of the first transistor and arranged between the gate of the first transistor and the channel region of the second transistor; a dielectric layer arranged at least between the portion of the electrically conductive material and the channel region of the second transistor; and a section of the channel region of the second transistor in a plane parallel to the two primary faces of the semiconductor layer is included in a section of the portion of the electrically conductive material projected in said plane.

10 Claims, 6 Drawing Sheets

(56) References Cited

OTHER PUBLICATIONS

Maxime Rousseau et al., "Impact of Substrate Coupling Induced by 3D-IC Architecture on Advanced CMOS Technology", European Microelectronics and Packaging Conference (EMPC), Rimini, Italy, 2009, pp. 1-5.

P. Batude et al., "3D CMOS Integration: Introduction of Dynamic Coupling and Application to Compact and Robust 4T SRAM", Integrated Circuit Design and Technology and Tutorial, 2008, IEEE international Conference 2008, pp. 1-4.

* cited by examiner

INTEGRATED CIRCUIT WITH ELECTROSTATICALLY COUPLED MOS TRANSISTORS AND METHOD FOR PRODUCING SUCH AN INTEGRATED CIRCUIT

TECHNICAL FIELD

The invention concerns the field of integrated circuits with superimposed MOS transistors, i.e. which can include several stacked levels of MOS transistors, and coupled to each other electrostatically. The invention also concerns a method for producing such integrated circuits.

BACKGROUND OF THE INVENTION

In an integrated circuit including MOS transistors, these transistors are generally produced from a single semiconductor layer in which the channels of these transistors are formed. This semiconductor layer is topped with metal interconnections forming contacts electrically connected to the gates and to the source and drain regions of the transistors.

Figure 1:
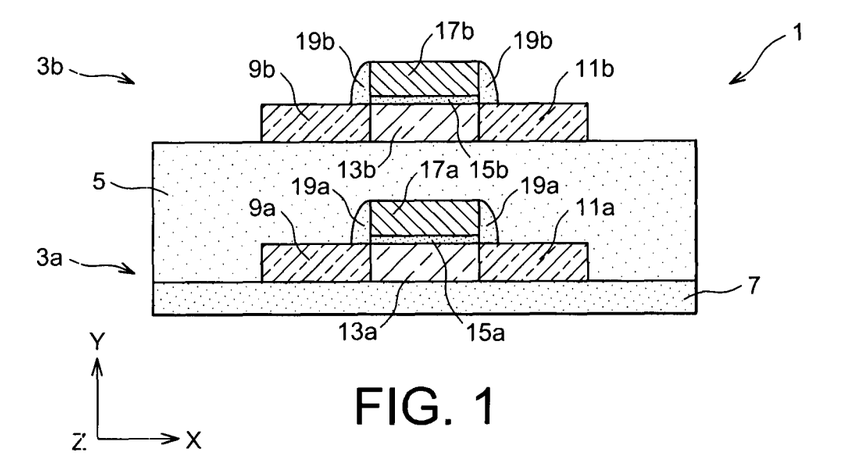
FIG. 1 shows an example of an integrated circuit including several stacked layers of MOS transistors according to the prior art.

In order to improve the integration density of the MOS transistors in the integrated circuits, it is known to produce integrated circuits including several stacked layers of transistors. One example of such an integrated circuit 1 is illustrated in FIG. 1. In this FIG. 1, only two transistors 3a and 3b, superimposed one on top of the other, of the integrated circuit 1 are illustrated. The upper transistor 3b is produced on a dielectric layer 5 covering the lower transistor 3a, which is itself realized on a dielectric layer 7, for example corresponding to the buried dielectric layer of a SOI (silicon on insulator) substrate. Each transistor 3a, 3b includes a semiconductor portion in which the source 9a, 9b and drain 11a, 11b regions are produced, as well as a region 13a, 13b designed to form the channel of the transistor 3a, 3b. A gate dielectric 15a, 15b topped with a gate 17a, 17b are arranged on the channel region 13a, 13b of each transistor 3a, 3b, the channel region 13a, 13b of each transistor 3a, 3b. Each stack formed by one of the gates 17a, 17b and one of the gate dielectrics 15a, 15b is surrounded by spacers 19a, 19b formed by one or several dielectric materials.

Relative to transistors produced from a single semiconductor layer, such a structure makes it possible to increase the integration density of the transistors in the integrated circuit. Moreover, such a structure makes it possible to modulate the electrical state of the interface between the region 13b designed to form the channel of the upper transistor 3b and the dielectric layer 5, or even, in the case of FD (fully depleted) transistors, to electrostatically couple the transistors that are superimposed on each other. Thus, in the example shown in FIG. 1, the gate 17a of the lower transistor 3a can serve to polarize the channel 13b of the upper transistor 3b, in particular owing to the small thickness of the dielectric layer 5, this thickness for example being less than about 50 nm, or less than about 30 nm or even 10 nm.

The effectiveness of such an electrostatic coupling is directly conditioned by the vertical alignment (alignment along the y axis shown in FIG. 1) between the gate 17a of the lower transistor 3a and the channel 13b of the upper transistor 3b. Thus, these two transistors 3a, 3b are correctly coupled in the case where the gate 17a of the lower transistor 3a is well aligned with the channel 13b of the upper transistor 3b, as is the case in FIG. 1. However, in the case where these elements are no longer correctly aligned in relation to each other, difficulties may then appear to polarize the channel 13b via the gate 17a.

Such an integrated circuit 1 may be obtained by realizing the lower and upper levels (including the lower transistor 3a and the upper transistor 3b, respectively) separately, then assembling them together via the dielectric layer 5. It is, however, difficult to obtain, with this technique, a good alignment between the transistors of the different levels, the best results obtained making it possible to obtain an alignment in the vicinity of 100 nm.

In order to obtain a better alignment, it is preferable to manufacture the integrated circuit 1 by producing the different levels of transistors sequentially: one first produces the lower level including the lower transistor 3a, then one produces the upper level, including the upper transistor 3b, directly on the lower level by aligning the gate 17b of the upper transistor 3b in relation to the gate 17a of the lower transistor 3a during the lithography step implemented to realize said gate 17b.

Although the alignment obtained with a sequential production of the levels of transistors is better than the alignment obtained by the separate production, then assembly of the levels of transistors, there is still an alignment uncertainty at least equal to about 40% of the minimum gate length (dimension along the x axis shown in FIG. 1) of the transistors.

BRIEF DESCRIPTION OF THE INVENTION

Thus there is a need to propose an integrated circuit with superimposed MOS transistors that can be coupled to each other electrostatically, the structure of which guarantees the electrostatic coupling between two superimposed MOS transistors of the integrated circuit, and that is only slightly or not at all sensitive to a misalignment that may appear between the two transistors during the production of the integrated circuit.

For this, proposed is an integrated circuit including at least a first MOS-type transistor on which at least a second MOS-type transistor is arranged, a channel region of which is formed in at least one semiconductor layer including two approximately parallel primary faces, and including at least one portion of at least one electrically conductive material electrically connected to a gate of the first transistor and arranged between the gate of the first transistor and the channel region of the second transistor, the section of the channel region of the second transistor in a plane parallel to the two primary faces of the semiconductor layer being included in the section of the portion of the electrically conductive material projected in said plane.

The section of the channel region of the second transistor in the plane parallel to the two primary faces of the semiconductor layer is included in the section of the portion of electrically conductive material projected in said plane, which translates the fact that the dimensions of the section of the portion of electrically conductive material projected in said plane are greater than the dimensions of the section of the channel region of the second transistor in said plane. Thus, it is possible to guarantee an electrostatic coupling between the channel of the upper transistor and the gate of the lower transistor even in the case where a misalignment appears between the transistors during the production of the integrated circuit.

One embodiment proposes an integrated circuit including at least:
 a first MOS-type transistor;
 a second MOS-type transistor, arranged on the first MOS-type transistor, whereof a channel region is formed in at least one semiconductor layer including two approximately parallel primary faces;

a portion of at least one electrically conductive material electrically connected to a gate of the first transistor and arranged between the gate of the first transistor and the channel region of the second transistor;

a dielectric layer arranged at least between the portion of the electrically conductive material and the channel region of the second transistor;

and in which the section of the channel region of the second transistor in a plane parallel to the two primary faces of the semiconductor layer is included in the section of the portion of the electrically conductive material projected in said plane, and the channel region of the second transistor is arranged between the portion of the electrically conductive material and a gate of the second transistor.

The portion of the electrically conductive material may be arranged on and/or against the gate of the first transistor.

The dimensions of the section of the portion of the electrically conductive material projected in the plane parallel to the two primary faces of the semiconductor layer may be greater by at least 10%, or 20%, or 30%, or 40%, or 50% in relation to the dimensions of the section of the channel region of the second transistor in said plane.

The dimensions of the section of the gate of the first transistor projected in the plane parallel to the two primary faces of the semiconductor layer may be approximately equal to the dimensions of the section of the channel region of the second transistor in said plane.

The integrated circuit may also include at least one dielectric layer arranged at least between the portion of the electrically conductive material and the channel region of the second transistor. This dielectric material may be composed of silicon oxide and/or an oxide with high permittivity (high-K) such as, for example, $HfO_2$ and/or $ZrO_2$ and/or $Al_2O_3$.

The thickness of the dielectric layer may be between about 1 nm and 500 nm, and preferably between about 5 nm and 50 nm.

The integrated circuit may include at least two levels of MOS-type transistors superimposed two by two, each level being able to include several MOS transistors.

In this case, it is possible for portions of at least one electrically conductive material to be electrically connected to the gates of each of the transistors of the lower level to achieve an electrostatic coupling between the channels of the upper transistors and the gates of the lower transistors. However, it is also possible for only part of the lower transistors to include a portion of electrically conductive material electrostatically coupling the gates of said lower transistors with the channels of the upper transistors that are superimposed on said lower transistors. The electrically conductive materials may be similar or different from one transistor to the other depending on the electrostatic coupling one wishes to obtain.

The portion of the electrically conductive material may include at least one stack of several electrically conductive materials. This or these material(s) able to form the portion of the electrically conductive material may be chosen in particular depending on their aptitude for being planarized and/or depending on their work function, which directly affects the characteristics of the upper transistor by offsetting it either toward high performance (by lowering the threshold voltage) or toward low consumption (by increasing the threshold voltage).

In this case, the portion of the electrically conductive material may include at least one titanium portion arranged between a tungsten portion and a portion composed of titanium nitride.

Also proposed is a method for producing an integrated circuit, including at least the following steps:

a) producing at least a first MOS-type transistor, b) producing at least one portion of at least one electrically conductive material electrically connected to a gate of the first transistor, c) producing at least one second MOS-type transistor on the first transistor, a channel region of the second transistor being formed in at least one semiconductor layer including two approximately parallel primary faces, the portion of the electrically conductive material being arranged between the gate of the first transistor and the channel region of the second transistor, the section of the channel region of the second transistor in a plane parallel to the two primary faces of the semiconductor layer being included in the section of the portion of the electrically conductive material projected in said plane.

One embodiment also concerns a method for producing an integrated circuit, including at least the following steps:

producing at least one first MOS-type transistor, producing at least one portion of at least one electrically conductive material electrically connected to a gate of the first transistor, depositing at least one dielectric layer covering at least the portion of the electrically conductive material, producing at least one second MOS-type transistor on the first transistor, a channel region of the second transistor being formed in at least one semiconductor layer including two approximately parallel primary faces and arranged on the dielectric layer, the portion of the electrically conductive material being arranged between the gate of the first transistor and the channel region of the second transistor, and in which the section of the channel region of the second transistor in a plane parallel to the two primary faces of the semiconductor layer is included in the section of the portion of the electrically conductive material projected in said plane, and the channel region of the second transistor is arranged between the portion of the electrically conductive material and a gate of the second transistor.

The step for producing the portion of the electrically conductive material may be obtained by carrying out the following steps:

conformal deposition of a first dielectric layer on the first transistor, deposition of a second dielectric layer on the first dielectric layer, planarization of the second dielectric layer with stop on the first dielectric layer, revealing a portion of the first dielectric layer covering the apex of the gate of the first transistor, etching of said portion of the first dielectric layer, revealing at least the apex of the gate of the first transistor, deposition of at least one layer composed of an electrically conductive material at least on the gate of the first transistor and on the remaining portions of the second dielectric layer, planarization of the layer composed of the electrically conductive material, forming the portion of the electrically conductive material electrically connected to the gate of the first transistor.

The method may also include, between step b) for producing the portion of the electrically conductive material and step c) for producing the second transistor, a step for depositing at least one dielectric layer covering at least the portion of the electrically conductive material, the semiconductor layer being arranged on said dielectric layer.

This method may be implemented so that the integrated circuit may include at least two levels of MOS-type transistors superimposed two by two, each level being able to include several MOS transistors.

In this case, portions of at least one electrically conductive material may be electrically connected to the gates of each or part of the transistors of the lower level to achieve an electrostatic coupling between the channels of the upper transistors and the gates of the lower transistors.

In one alternative, the portion(s) of electrically conductive material may be produced by a standard photolithography process.

BRIEF DESCRIPTION OF THE DRAWINGS

The present invention will be better understood upon reading the description of embodiments provided purely for information and in no way limitingly in reference to the appended drawings, in which.

Identical, similar or equivalent parts of the different figures described hereinafter bear the same numerical references so as to facilitate the transition from one figure to another.

The different parts illustrated in the figures are not necessarily shown using a uniform scale, to make the figures more legible.

The different possibilities (alternatives and embodiments) must be understood as not being mutually exclusive and may be combined with one another.

DETAILED DESCRIPTION OF SPECIFIC EMBODIMENTS

Figure 2A:
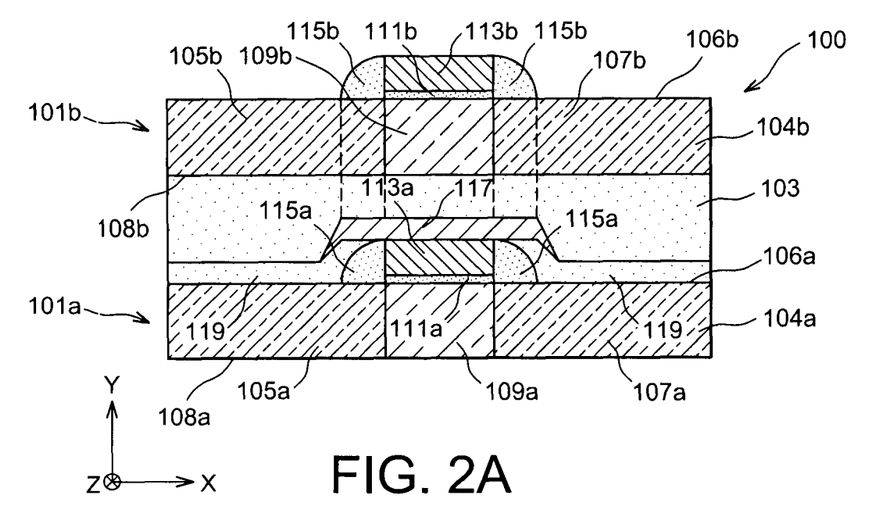
FIGS. 2A and 2B illustrate embodiments of an integrated circuit with MOS transistors coupled electrostatically according to a particular embodiment.

We will first refer to FIG. 2A, which illustrates one embodiment of an integrated circuit 100 with MOS transistors coupled to each other electrostatically, according to one specific embodiment.

In this FIG. 2A, the integrated circuit 100 includes two levels of MOS transistors. Furthermore, only two transistors 101a and 101b of the integrated circuit 100, superimposed one on top of the other, are shown in FIG. 2A. The upper transistor 101b is produced on a dielectric layer 103, for example SiO$_2$-based, covering the lower transistor 101a, which is itself produced on a dielectric layer, not shown in FIG. 2A, which is for example the buried dielectric layer, for example SiO$_2$-based, of a SOI (silicon on insulator) substrate. Alternatively, it is possible for the lower transistor 101a to be produced on a massive substrate, for example silicon. Each transistor 101a, 101b includes a portion of a layer, referenced 104a and 104b, respectively, composed of a semiconductor material, for example silicon, in which the source 105a, 105b and drain 107a, 107b regions are produced as well as a region 109a, 109b designed to form the channel of the transistor 101a, 101b. The semiconductor layers 104a, 104b have an approximately planar shape and each include two primary faces 106a, 106b and 108a, 108b approximately parallel to each other, and parallel to the plane (X, Z) illustrated in FIG. 2A.

For each transistor 101a, 101b, a gate dielectric 111a, 111b, for example composed of SiO$_2$ or a dielectric material with high permittivity (High-K), i.e. whereof the permittivity is greater than about 3.9, for example Ta$_2$O$_5$, topped with a gate 113a, 113b, for example composed of a metal such as tungsten or a doped polycrystalline semiconductor, are arranged on the channel region 109a, 109b of each transistor 101a, 101b. Each stack formed by a gate 113a, 113b and a gate dielectric 111a, 111b is surrounded by spacers 115a, 115b composed of one or several dielectric materials, and for example composed of SiO$_2$ and/or Si$_3$N$_4$.

The integrated circuit 100 also includes dielectric portions 119 covering the source 105a and drain 107a regions of the lower transistor 101a. These dielectric portions 119 also cover at least a part of the spacers 115a of this lower transistor 101a. The integrated circuit 100 also includes a portion 117 composed of one or several electrically conductive materials, electrically connected to the gate 113a of the lower transistor 101a. In the example of FIG. 2A, this electrically conductive portion 117 is arranged on and against the gate 113a, and totally covers the peak of the gate 113a. Moreover, the portion 117 also covers a part of the spacers 115a as well as a part of the dielectric portions 119. The section of the channel region 109b of the upper transistor 101b in a plane parallel to the two primary faces 106b, 108b of the semiconductor layer 104b is included in the section of the portion 117 of the electrically conductive material projected in this plane. The dimensions of the section of the electrically conductive portion 117, in a plane parallel to the plane (X, Z), are greater than the dimensions of the section of the channel region 109b of the upper transistor 101b in that same plane.

In light of the small thickness of the dielectric layer 103 between the electrically conductive portion 117 and the channel region 109b of the upper transistor 101b, which is for instance between about 1 nm and 500 nm, and advantageously between about 5 nm and 50 nm, it is possible to polarize the channel of the upper transistor 101b from the gate 113a of the lower transistor 101a, via the electrically conductive portion 117. The two transistors 101a, 101b can therefore be coupled together electrostatically.

Given that the dimensions (in a plane parallel to the (X, Z) plane) of the electrically conductive portion 117 are greater than those of the channel region 109b of the upper transistor 101b in that same plane, we therefore see that the integrated circuit 100 tolerates a misalignment between the transistors 101a and 101b, i.e. a misalignment between the gate 113a of the lower transistor 101a and the channel 109b of the upper transistor 101b. In the example of FIG. 2A, the transistors 101a and 101b are well aligned in relation to each other, which does not pose any electrostatic coupling problems. However, in the example of FIG. 2B, we see that the gate 113a of the lower transistor 101a is not aligned with the channel region 109b of the upper transistor 101b. Such a misalignment would not have made it possible to perform an electrostatic coupling between two superimposed transistors of the prior art. But in the present case, given that the electrically conductive portion 117 is electrically connected to the gate 113a of the lower transistor 101a and the section of the channel region 109b of the upper transistor 101b in a plane parallel to the two primary faces 106b, 108b of the semiconductor layer 104b is included in the section of the portion 117 of electrically conductive material projected in that plane, it is therefore possible to perform an electrostatic coupling between those two transistors 101a, 101b, the gate 113a of the lower transistor 101a being able to polarize the channel region 109b of the upper transistor 101b via the electrically conductive portion 117.

The dimensions of the electrically conductive portion 117 are in particular chosen as a function of the misalignment that may appear during the realization of the integrated circuit 100. For example, if in a given technology, the misalignment tolerance represents about 40% of the gate length, one may produce the electrically conductive portion 117 such that the length (dimension along the X axis shown in FIGS. 2A and 2B) of that portion 117 is greater by at least about 40%, or more, relative to the length of the gates 113a, 113b of the transistors 101a, 101b of the integrated circuit 100. The table below provides examples, for different gate lengths (in nm), of tolerated misalignment (in nm) as well as the length of the electrically conductive portion 117 (in nm).

Figure 2B:
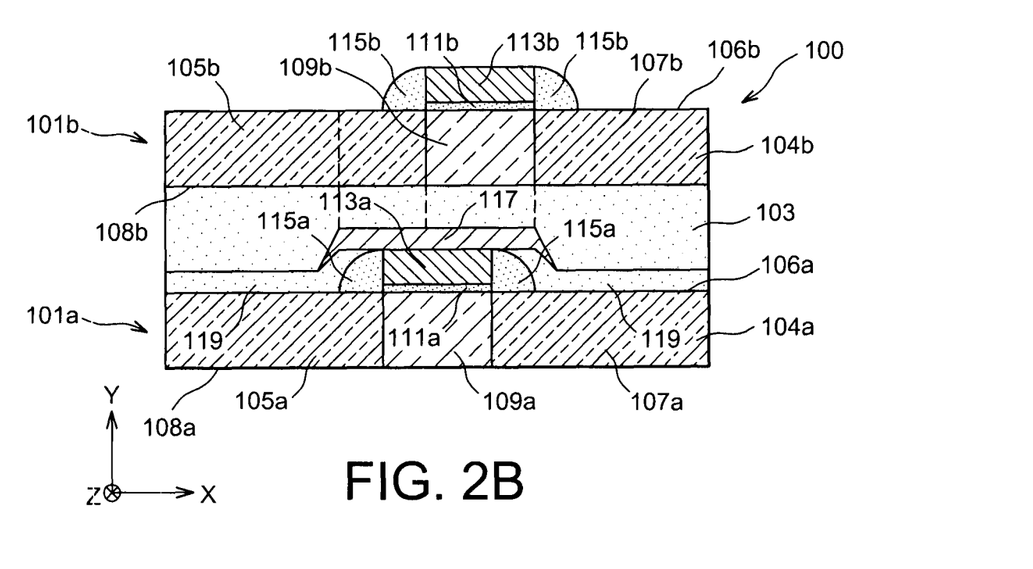

| $L_{gate}$ | 27 | 24 | 22 | 18 | 17 | 15 | 14 | 13 |
|---|---|---|---|---|---|---|---|---|
| Misalignment | 11 | 10 | 9.9 | 9 | 7.1 | 6.3 | 5.6 | 5 |
| $L_{conduc\,portion}$ | 38 | 34 | 31.9 | 27 | 34.1 | 21.3 | 19.6 | 18 |

In the example of FIGS. 2A and 2B, the integrated circuit 100 includes two levels of MOS transistors, several transistors for example similar to the transistors 101a and 101b being able to be produced on each stage. In this case, it is possible for portions of electrically conductive material to be electrically connected to the gates of each of the transistors from the lower level, or to only part of the transistors from the lower level, to achieve an electrostatic coupling between the channels of the upper transistors and the gates of those lower transistors. The electrically conductive materials may be similar or different from one transistor to the other depending on the electrostatic coupling one wishes to obtain.

In the example of FIGS. 2A and 2B, the integrated circuit 100 includes two levels of superimposed MOS transistors. It is possible for the integrated circuit 100 to include more than two levels of superimposed transistors. Thus, a transistor in the first level can be electrostatically coupled with a transistor from the second level, which itself can be electrostatically coupled with a transistor from the third level, etc.

We will now refer to FIGS. 3A to 3J, which illustrate the steps of a method for producing the integrated circuit 100 according to one particular embodiment.

Figure 3A:
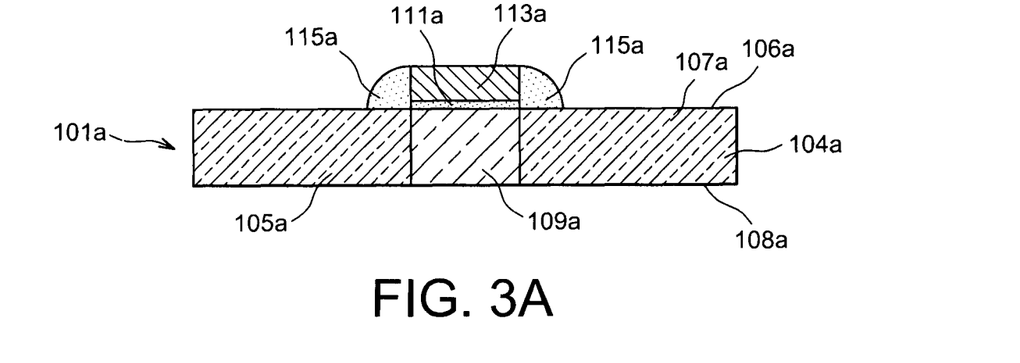
FIGS. 3A to 3J illustrate the steps of a method for producing an integrated circuit with MOS transistors coupled electrostatically according to one particular embodiment.

As shown in FIG. 3A, one first realizes the lower MOS transistor 101a, for example from a SOI substrate. This transistor 101a is obtained by carrying out steps known by those skilled in the art, which will not be described in detail here.

Figure 3B:
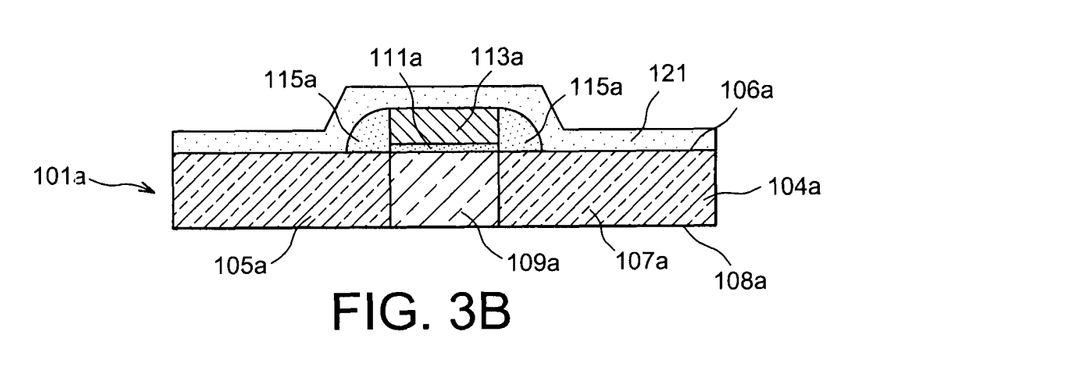

One then covers the lower transistor 101a with a conformal deposition, for example of the CVD (chemical vapor deposition) type, with a first dielectric layer, for example composed of nitride such as $Si_3N_4$ (FIG. 3B). This first dielectric layer 121 covers at least the source 105a and drain 107a regions, at the upper face 106a of the semiconductor layer 104a, as well as the spacers 115a and the gate 113a of the lower transistor 101a. The approximately constant thickness of this first dielectric layer 121, for example between about 5 nm and 50 nm, is chosen according to the desired length of the electrically conductive portion 117 that will be produced subsequently. It is for example equal to about half of the difference of dimensions between the gate length and the length of the electrically conductive portion.

Figure 3C:
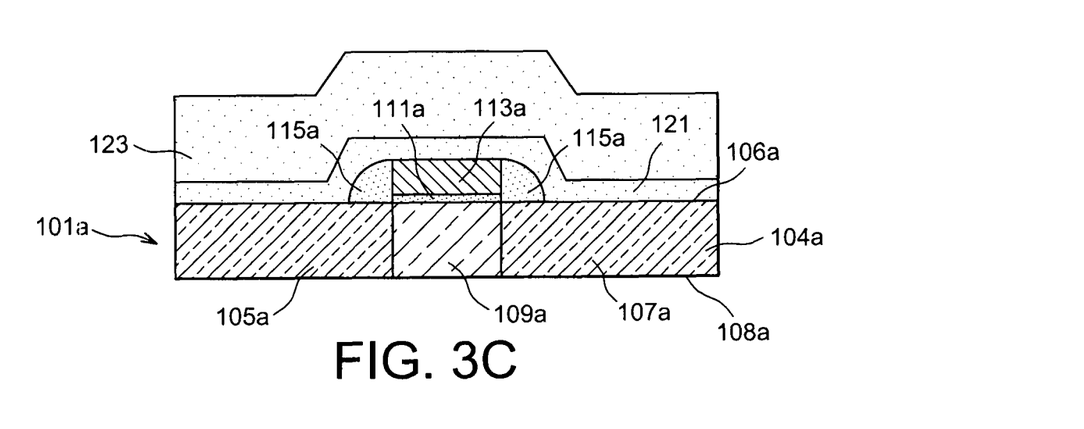

The first dielectric layer 121 is covered by a second dielectric layer 123, for example composed of an oxide such as $SiO_2$, deposited for example by implementing a CVD-type deposition (FIG. 3C). The thickness of the second dielectric layer 123 is for example chosen such that it is at least greater than 2.5 times the rise between the top of the gate 113a and the surface of the lateral insulation of the corresponding active zone, in the case where the transistor is produced on a SOI substrate, at the high level of the buried oxide of the SOI. Typically this thickness is in the vicinity of 400 nm for a rise of about 150 nm. The materials of the first dielectric layer 121 and of the second dielectric layer 123 may in particular be chosen so as to allow selective etching of the second dielectric layer 123 in relation to the first dielectric layer 121.

Figure 3D:
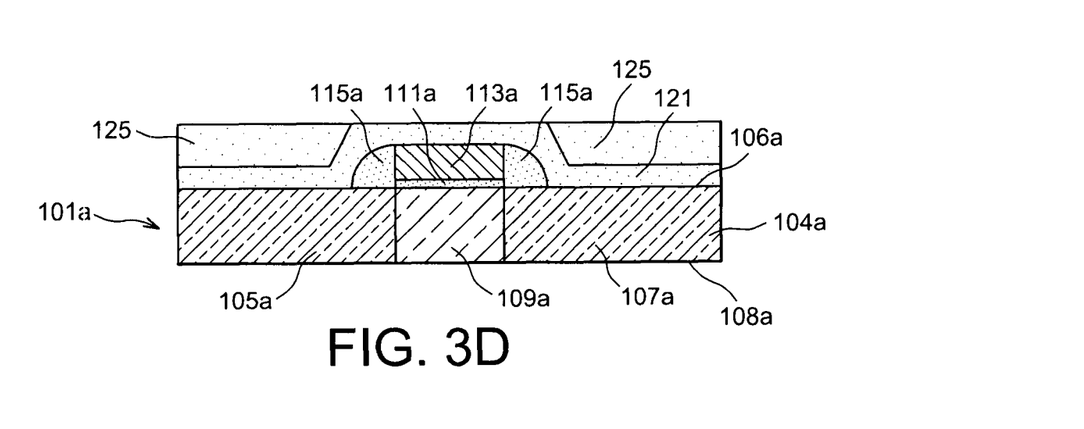

As illustrated in FIG. 3D, the second dielectric layer 123 is planarized, for example by implementing a CMP (chemical mechanical planarization), then possibly etched, with a stop on the first dielectric layer 121, forming second dielectric portions 125. These second dielectric portions will subsequently form a portion of the dielectric layer 103 insulating the transistors 101a and 101b from each other.

Figure 3E:
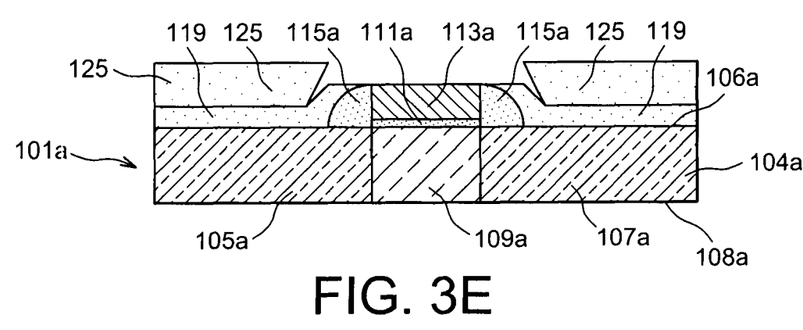

The first dielectric layer 121 is then etched, for example by chemical etching, selectively in relation to the second dielectric portions 125 (FIG. 3E). This etching is stopped in time so as only to expose the apex of the gate 113a of the lower transistor 101a. This etching forms first dielectric portions 119 that cover the source 105a and drain 107a regions as well as the spacers 115a.

Figure 3F:
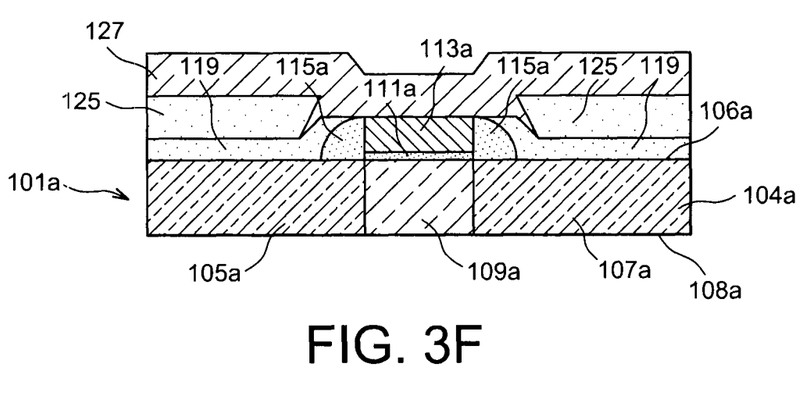

As shown in FIG. 3F, one then performs a deposition of one or several electrically conductive materials, for example here a stack 127 of three layers composed of tungsten, titanium, and titanium nitride, covering the apex of the gate 113a as well as the second dielectric portions 125 and the parts of the first dielectric portions 119 not covered by the second dielectric portions 125.

Figure 3G:
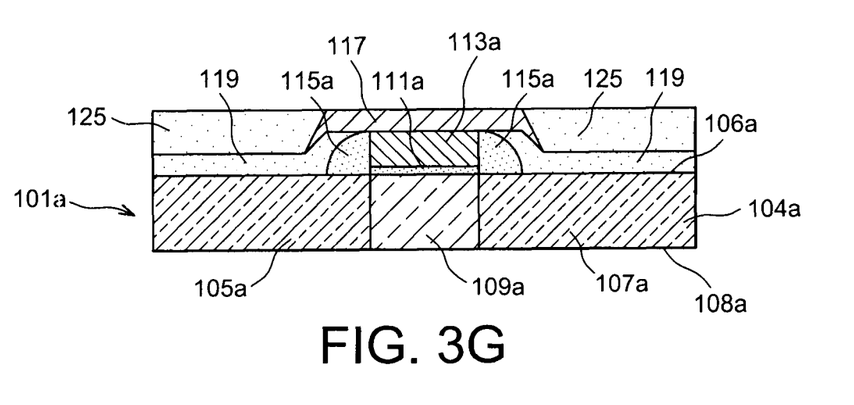

The stack 127 is then planarized by CMP with a stop on the second dielectric portions 125 (FIG. 3G). The remaining portion of the stack 127 forms the electrically conductive portion 117 that is electrically in contact with the gate 113a. Moreover, the electrically conductive portion 117 is arranged between the second dielectric portions 125.

Figure 3H:
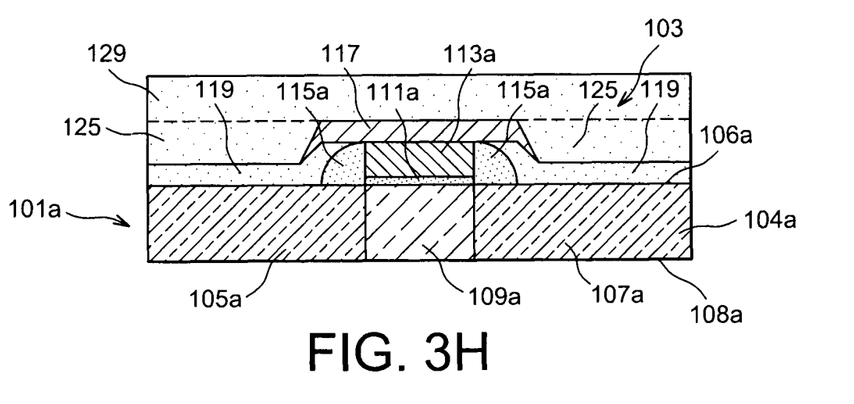

As shown in FIG. 3H, a third dielectric layer 129, for example composed of oxide such as $SiO_2$ or a High-K oxide, is then deposited on the second dielectric portions 125 and on the electrically conductive portion 117. The thickness of the third dielectric layer 129 is for example between about 1 nm and 500 nm and advantageously, in particular when this third dielectric layer 129 is composed of $SiO_2$, between about 5 nm and 50 nm, which will subsequently make it possible to perform an electrostatic coupling between the gate 113a of the lower transistor 101a and the channel 109b of the upper transistor 101b. This third dielectric layer 129 may also be formed by a stack of several dielectric layers made of different materials. This third dielectric layer 129 and the second dielectric portions 125 together form the dielectric layer 103 designed to electrically insulate the lower transistor 101a from the upper transistor 101b.

One of the advantages of this method is that it makes it possible to finely control the thickness of the coupling dielectric 129 by using the second dielectric portions 125 as stop layer for the CMP carried out. One then deposits, at the third dielectric layer 129, just what is needed as dielectric to subsequently attach, for example by gluing, the layer 104b, thereby ensuring good coupling.

Figure 3I:
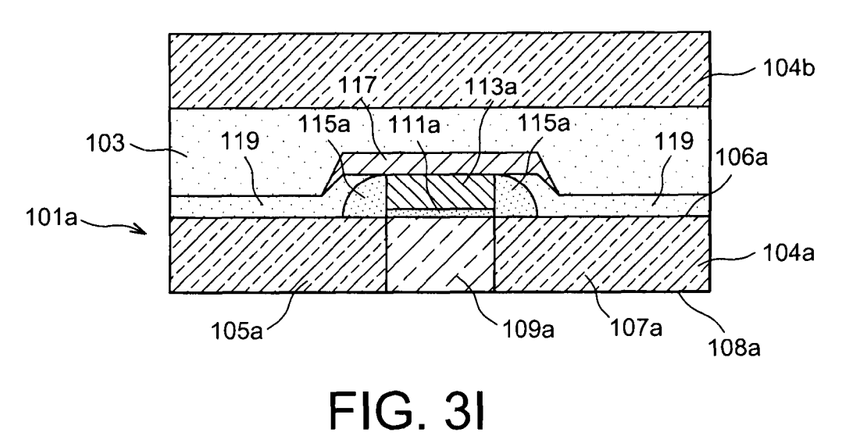

One then attaches the semiconductor layer 104b on the dielectric layer 103 (FIG. 3I). The technique implemented to perform such an attachment is for example similar to that described in the document "3D CMOD Integration: Introduction of Dynamic coupling and Application to Compact and Robust 4T SRAM" by P. Batude et al., Integrated Circuit Design and Technology and Tutorial, 2008. ICICDT 2008; IEEE International Conference on Volume, 2-4 Jun. 2008; Pages 281-284.

Figure 3J:
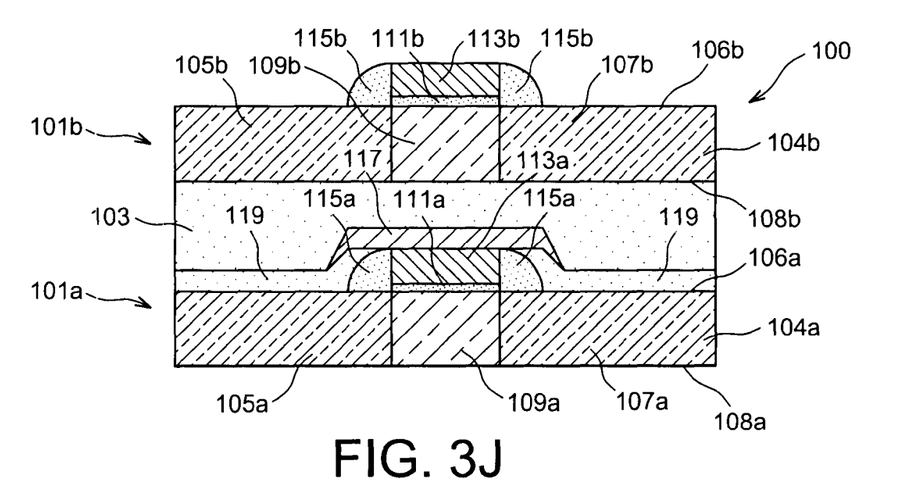

Lastly, as shown in FIG. 3J, the integrated circuit 100 is completed by producing the upper transistor 101b from the active semiconductor layer 104b, for example by steps similar to those implemented to produce the lower transistor 101a. The transistors 101a and 101b of the integrated circuit 100 shown in FIG. 3J are well aligned here in relation to each other, as in the example of FIG. 2A. However, it is possible for a misalignment to appear between these transistors as in the example of FIG. 2B. This misalignment will not, however, have any consequences given that the electrostatic coupling between the gate 113a of the lower transistor 101a and the channel 109b of the upper transistor 101b will be ensured by the electrically conductive portion 117 arranged against the gate 113a of the lower transistor 101a.

Later steps for producing electrical contacts and/or interconnection levels may then be carried out in order to complete the production of the integrated circuit 100.

Other techniques may of course be used to produce the conductive portions 117, for example using standard photolithography techniques. These conductive portions may also be produced by resuming silicon or germanium epitaxy, for example from a gate composed of polysilicon.

Such an integrated circuit 100 is for example a memory cell, for example of the SRAM, or ZRAM or FPM ("Fast Page Mode") type, or a logic circuit with CMOS logic gates.

The invention claimed is:

1. An integrated circuit including at least:
   a first MOS transistor;
   a second MOS transistor, arranged on the first MOS transistor, the second MOS transistor including a channel region in at least one semiconductor layer including two approximately parallel primary faces;
   at least one electrically conductive material electrically connected to a gate of the first MOS transistor and arranged between the gate of the first MOS transistor and the channel region of the second MOS transistor;
   a first dielectric layer arranged at least between the electrically conductive material and the channel region of the second MOS transistor;
   a plurality of spacers that surround the gate of the first MOS transistor; and
   a second dielectric layer that at least partially covers a source and drain region of the first MOS transistor and which includes a portion that at least partially covers the plurality of spacers, such that the at least one electrically conductive material covers both the plurality of spacers and at least partially covers the second dielectric layer, wherein
   the channel region of the second MOS transistor in a plane parallel to the two primary faces of the semiconductor layer is completely included within a projection of the electrically conductive material in said plane,
   a length, in a cross-sectional view, of the electrically conductive material projected in said plane is greater than a length, in the cross-sectional view, of the channel region of the second MOS transistor projected in said plane, and
   the channel region of the second MOS transistor is arranged between the electrically conductive material and a gate of the second MOS transistor.

2. The integrated circuit according to claim 1, wherein the electrically conductive material is arranged on and/or against the gate of the first MOS transistor.

3. The integrated circuit according to claim 1, wherein a length of a section of the gate of the first MOS transistor in the plane parallel to the two primary faces of the semiconductor layer are approximately equal to the length of the channel region of the second MOS transistor in said plane.

4. The integrated circuit according to claim 1, wherein a thickness of the first dielectric layer is between about 5 nm and 50 nm.

5. The integrated circuit according to claim 1, including at least two levels of MOS transistors superimposed two by two, each layer including several MOS transistors.

6. The integrated circuit according to claim 1, wherein the electrically conductive material includes at least one stack of several electrically conductive materials.

7. The integrated circuit according to claim 1, wherein the electrically conductive material includes at least one titanium portion arranged between a tungsten portion and a portion composed of titanium nitride.

8. The integrated circuit according to claim 1, wherein the channel of the second MOS transistor and the gate of the first transistor are electrostaticly coupled to each other.

9. The integrated circuit according to claim 1, wherein the first MOS transistor and the second MOS transistor are misaligned.

10. The integrated circuit according to claim 1, wherein a thickness of the first dielectric layer is between about 5 nm and 50 nm and the channel of the second MOS transistor and the gate of the first transistor are electrostaticly coupled to each other.

* * * * *